(12) United States Patent
Chen et al.

(10) Patent No.: US 7,525,150 B2
(45) Date of Patent: Apr. 28, 2009

(54) HIGH VOLTAGE DOUBLE DIFFUSED DRAIN MOS TRANSISTOR WITH MEDIUM OPERATION VOLTAGE

(75) Inventors: Fu-Hsin Chen, Gaoshu Township (TW); Yi-Chun Lin, Hsin-Chu (TW); Ruey-Hsin Liu, Miaoli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 752 days.

(21) Appl. No.: 10/819,527

(22) Filed: Apr. 7, 2004

(65) Prior Publication Data

US 2005/0227448 A1  Oct. 13, 2005

(51) Int. Cl.
*H01L 29/78* (2006.01)
(52) U.S. Cl. ............... 257/335; 257/336; 257/337; 257/339; 257/344; 257/E29.268; 257/E29.279
(58) Field of Classification Search ......... 257/335–337, 257/344, 339, E29.268, E29.279; 438/286
See application file for complete search history.

(56) References Cited

U.S. PATENT DOCUMENTS

| | | | | |
|---|---|---|---|---|
| 5,567,965 A * | 10/1996 | Kim | ............... | 257/336 |
| 5,654,569 A | 8/1997 | Ko | | |
| 5,780,893 A * | 7/1998 | Sugaya | ............... | 257/318 |
| 5,801,416 A * | 9/1998 | Choi et al. | ............... | 257/335 |
| 6,255,154 B1 * | 7/2001 | Akaishi et al. | ............... | 438/217 |
| 6,297,108 B1 | 10/2001 | Chu | | |
| 6,323,074 B1 * | 11/2001 | Jiang et al. | ............... | 438/202 |
| 6,333,234 B1 | 12/2001 | Liu | | |
| 6,597,038 B1 | 7/2003 | Hashimoto | | |
| 7,045,414 B2 * | 5/2006 | Chen et al. | ............... | 438/231 |
| 7,101,764 B2 * | 9/2006 | Petti | ............... | 438/286 |
| 7,138,689 B2 * | 11/2006 | Inoue et al. | ............... | 257/392 |
| 7,166,903 B2 * | 1/2007 | Mitros et al. | ............... | 257/532 |
| 7,196,375 B2 * | 3/2007 | Chen et al. | ............... | 257/336 |
| 2003/0057429 A1 * | 3/2003 | Schmidt | ............... | 257/99 |
| 2004/0038484 A1 * | 2/2004 | Wang et al. | ............... | 438/286 |
| 2004/0173859 A1 * | 9/2004 | Hao et al. | ............... | 257/408 |
| 2005/0112826 A1 * | 5/2005 | Chen et al. | ............... | 438/286 |
| 2006/0113627 A1 * | 6/2006 | Chen et al. | ............... | 257/500 |
| 2006/0163626 A1 * | 7/2006 | Chen et al. | ............... | 257/288 |
| 2006/0231870 A1 * | 10/2006 | Park et al. | ............... | 257/272 |
| 2007/0085145 A1 * | 4/2007 | Tien et al. | ............... | 257/368 |

OTHER PUBLICATIONS

Quirk, Michael et al., "Characteristics of Semiconductor Materials," Semiconductor Manufacturing Technology, Prentice Hall, 2001, pp. 33-37.*

* cited by examiner

*Primary Examiner*—M. Wilczewski
*Assistant Examiner*—Toniae M Thomas
(74) *Attorney, Agent, or Firm*—Slater & Matsil, L.L.P.

(57) ABSTRACT

A method of fabricating a high voltage MOS transistor with a medium operation voltage on a semiconductor wafer. The transistor has a double diffused drain (DDD) and a medium operation voltage such as 6 to 10 volts, which is advantageous for applications having both low and higher operation transistor devices. The second diffusion region of the DDD is self-aligned to the spacer on the sidewalls of the gate and gate dielectric, so that the transistor size may be decreased.

11 Claims, 6 Drawing Sheets

HIGH VOLTAGE DOUBLE DIFFUSED DRAIN MOS TRANSISTOR WITH MEDIUM OPERATION VOLTAGE

TECHNICAL FIELD

The present invention relates generally to the fabrication of semiconductor devices, and more particularly to the fabrication of transistor devices with double diffused drains (DDD).

BACKGROUND

The trend in the semiconductor industry is towards reducing device dimensions. For example, in the manufacturing of highly dense integrated circuits that use metal oxide semiconductor field effect transistors (MOSFETs), as device dimensions are decreased, there is a need to create shallower source and drain regions. However, the high doping concentrations of shallow source and drain regions lead to an increase in the electric field in the channel close to the drain. The high electric field causes electrons in the device channel to gain energy and be injected into the gate oxide, which is a phenomenon that is referred to as a "hot electron" problem. The hot electron phenomenon leads to long term device degradation and reduced reliability.

One approach to minimize the hot electron problem is by using a double diffused drain method, in which two implants are performed to form a drain. For example, a double diffused drain (DDD) is often used as a source or drain in a high voltage metal oxide semiconductor (HVMOS) transistor. The term "high voltage transistor" used herein generally refers to a transistor device having a high breakdown voltage.

A double diffused drain provides a high breakdown voltage for a HVMOS transistor and prevents electrostatic discharge that may result in the destruction of a semiconductor device. A double diffused drain also provides a solution to hot electron effects which result from shortened channeling in the MOS transistor.

High voltage devices are sometimes manufactured on the same chip as low voltage devices (e.g., having a low breakdown voltage relative to the higher breakdown voltage of the high voltage devices). It is important that the high voltage transistors do not deleteriously affect the performance of the low voltage transistors in such a structure.

What is needed in the art are improved methods of forming double diffused drain structures and improved double diffused drain structures.

SUMMARY OF THE INVENTION

These and other problems are generally solved or circumvented, and technical advantages are generally achieved, by preferred embodiments of the present invention, in which a high voltage DDDMOS structure comprises two diffusion regions in a drain region, wherein the second-formed diffusion region is self-aligned to a spacer adjacent the gate. A first diffusion region is formed in a workpiece before the gate material is deposited, and the first diffusion region is driven in using an anneal process. After the formation of the gate, a second diffusion region is formed within the workpiece. One edge of the second diffusion region abuts the field oxide or isolation region at the outer part of the drain region, thus allowing the transistor size to be significantly decreased.

In accordance with a preferred embodiment of the present invention, a method of fabricating a semiconductor device includes providing a workpiece, and forming a first isolation region and a second isolation region in the workpiece, the first isolation region being proximate a first source region of the workpiece, the second isolation region being proximate a first drain region of the workpiece, the first source region and the first drain region being separated by a first channel region within the workpiece. The method includes forming a first diffusion region in the first drain region of the workpiece, the first diffusion region comprising a first depth within the workpiece and comprising a dopant. The method includes driving in the dopant of the first diffusion region into the workpiece to increase the first depth of the first diffusion region to a second depth. A first gate is formed over the first channel region of the workpiece, wherein the first gate is proximate the first diffusion region. Second diffusion regions are formed in the first source region of the workpiece and in the first diffusion region in the first drain region, the second diffusion regions comprising a third depth within the workpiece, the third depth being less than the second depth, wherein the second diffusion region in the first source region comprises a source of a first transistor, and wherein the first diffusion region and the second diffusion region in the first drain region comprise a drain of the first transistor.

In accordance with another preferred embodiment of the present invention, a method of fabricating a semiconductor device includes providing a workpiece, and forming a first isolation region, a second isolation region, a third isolation region, and a fourth isolation region in the workpiece, the first isolation region being proximate a first source region of the workpiece, the second isolation region being proximate a first drain region, the first source region and the first drain region being separated by a first channel region. The third isolation region is proximate a second source region of the workpiece, the fourth isolation region is proximate a second drain region of the workpiece, and the second source region and the second drain region are separated by a second channel region. A first diffusion region is formed in the first drain region of the workpiece, the first diffusion region comprising a first depth within the workpiece and comprising a dopant. The method includes driving in the dopant of the first diffusion region to increase the first depth of the first diffusion region to a second depth, a first gate insulator is formed over the first channel region, and a second gate insulator is formed over the second channel region of the workpiece. A first gate is formed over the first gate insulator, and a second gate is formed over the second gate insulator, the first gate and the second gate including sidewalls. The method includes lightly doping the first source region, the second source region and the second drain region, forming spacers on the sidewalls of the first gate and the second gate, and forming second diffusion regions in the first source region, the first diffusion region in the first drain region, the second source region, and the second drain region. The second diffusion regions comprise a third depth within the workpiece, the third depth being less than the second depth, wherein the second diffusion region in the first source region comprises a source of a first transistor, wherein the first diffusion region and the second diffusion region in the first drain region comprise a drain of the first transistor, wherein the second diffusion region in the second source region comprises a source of a second transistor, and wherein the second diffusion region in the second drain region comprises a drain of the second transistor.

In accordance with yet another preferred embodiment of the present invention, a semiconductor device includes a workpiece, and a first isolation region and a second isolation region disposed in the workpiece, the first isolation region being proximate a first source region of the workpiece, and the second isolation region being proximate a first drain region of the workpiece. The first source region and the first drain region are separated by a first channel region. A first diffusion region is disposed in the first drain region of the workpiece, the first diffusion region comprising a first depth within the workpiece, and a first gate is disposed over the first channel region of the workpiece proximate the first diffusion region. Second diffusion regions are disposed in the first source region of the workpiece and in the first diffusion region in the first drain region, the second diffusion regions comprising a second depth within the workpiece, the second depth being less than the first depth, wherein the second diffusion region in the first source region comprises a source of the first transistor, and wherein the first diffusion region and the second diffusion region in the first drain region comprise a drain of the first transistor.

Advantages of preferred embodiments of the present invention include providing an HV DDDMOS structure and method of manufacture thereof, wherein one of the diffusion regions of the DDD is formed before the formation of the gate of the transistor. The second-formed diffusion region is self-aligned to the spacer adjacent the gate, resulting in a transistor that has a medium operating voltage, e.g., about 6 volts to 10 volts. The novel HV DDDMOS structure allows the transistor to be manufactured in a smaller scale, e.g., about 50% smaller than prior art HV DDDMOS transistors. Advantageously, no additional masks are required to manufacture the device. If low voltage devices or transistors are fabricated on the same integrated circuit, their performance is not degraded by the presence of the high voltage DDDMOS transistor having a medium operating voltage. Furthermore, the resistance $R_{on}$ of the HV DDDMOS may be reduced.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an HV DDDMOS device. Embodiments of the present invention may also be applied, however, to other transistor structures and methods of fabrication thereof. While only one or two transistors are shown in each figure, there may be many transistors formed simultaneously on a single semiconductor workpiece (not shown).

Figure 1:
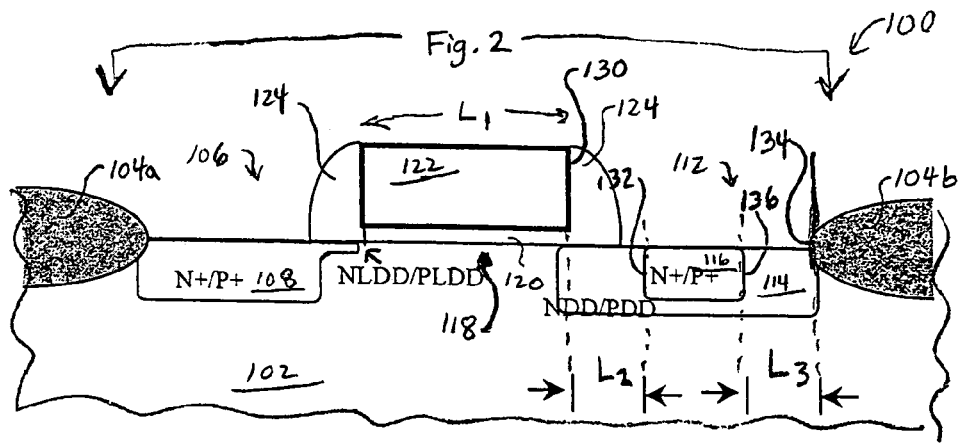
FIG. 1 shows a cross-sectional view of a prior art HV DDDMOS transistor.

With reference now to FIG. 1, there is shown a prior art HVMOS transistor 100 which includes a workpiece 102 in which field oxide regions 104a and 104b have been formed. The transistor 100 includes a source 106 that comprises an N+ or P+ (N+/P+) region 108. The drain 112 of the transistor 100 comprises a first diffusion region 114 and a second diffusion region 116 formed within the workpiece 102, within the first diffusion 114, as shown. The first diffusion region 114 may comprise an NDD or PDD (NDD/PDD) region comprising an n/p type double diffused region, for example. A lightly doped NLDD or PLDD (NLDD/PLDD) region comprising an n/p type lightly doped double diffused region may also be formed in the source 106, as shown. A channel region 118 resides between the source 106 and the drain 112 within the workpiece 102, beneath the gate oxide 120 and the gate 122. Spacers 124 are formed on either side of the gate 122.

Figure 2:
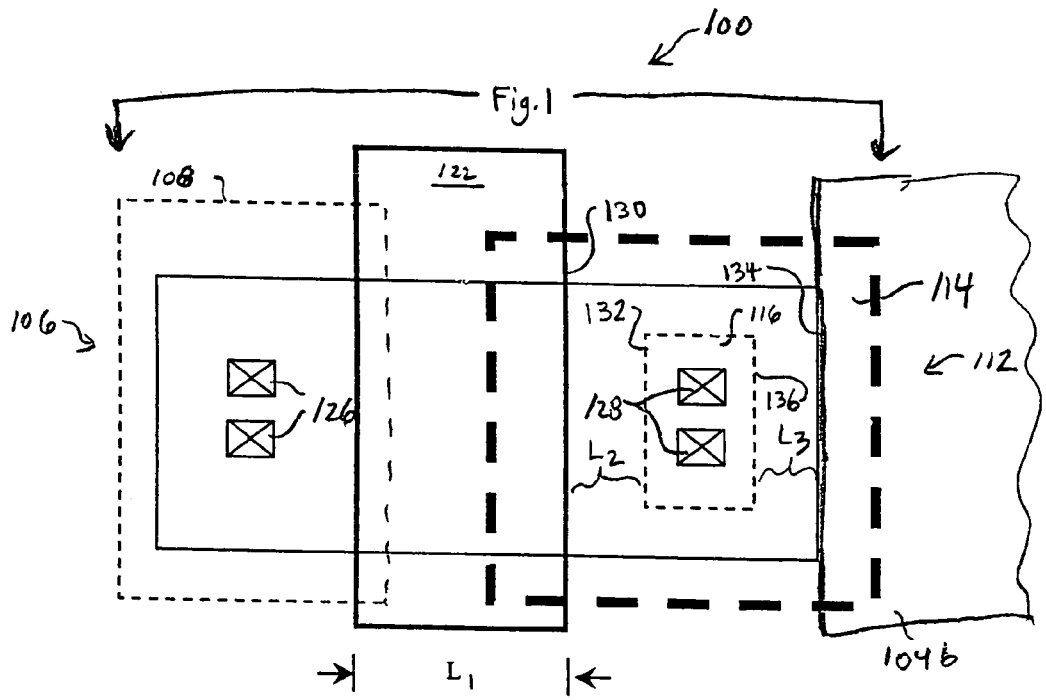
FIG. 2 shows a top view of the HV DDDMOS transistor shown in FIG. 1.

A top view of the transistor 100 is shown in FIG. 2. Contacts 126 for the source 106 are formed over the source 106, and contacts 128 for the drain 112 are formed over the drain 112, as shown. From this top view, the underlying N+/P+ region 108 of the source 106 and the first diffusion region 114 and the second diffusion region 116 of the drain 112 can be seen in phantom.

A problem with the HVMOS transistor 100 shown in FIGS. 1 and 2 is that the second diffusion region 116 of the drain 112 is not self-aligned to the structure. Lightly doped drain extensions $L_2$ and $L_3$ are included in the transistor 100 to reduce the crowding of the electric field and equi-potential lines between the gate electrode 122 and the drain contacts 128 (not shown). The transistor 100 shown leads to an increase of the avalanche breakdown voltage and thus can provide an HVMOS transistor 100 having a breakdown voltage of about 22 volts and an operating voltage of about 12 to 16 volts, for example. However, a disadvantage of the transistor 100 shown is that it is quite large and requires a large amount of lateral surface area on a semiconductor workpiece 102. For example, the distance $L_2$ required by the drain extension between the gate 122 edge 130 and the edge 132 of the second diffusion region 116 may comprise about 1.5 μm. Likewise, the space $L_3$ required by the drain extension between an opposing edge 136 of the second diffusion region 116 and an edge 134 of the field oxide 104b may also comprise about 1.5 µm. The gate 122 may comprise a width $L_1$ of about 1.8 µm, and the second diffusion region 116 may comprise a width of about 0.75 µm, as examples.

What is needed in the art is a DDDMOS device that may be made smaller and thus requires less surface area on an integrated circuit. In some semiconductor applications, such as notebook computer liquid crystal display (LCD) driver circuits, it is necessary to combine low voltage transistors with higher voltage transistors, but a high breakdown voltage such as 22 volts may be unnecessary. In these applications, chip size can be a major concern. Furthermore, in some applications, a medium voltage transistor, having a breakdown voltage of less than 22 volts, may be used in conjunction with a lower voltage transistor on a single integrated circuit.

Embodiments of the present invention achieve technical advantages by providing a HV DDDMOS transistor design, and method of manufacture thereof, that requires a minimal amount of lateral surface area on a semiconductor workpiece, has a medium operating voltage such as about 6 to 10 volts, for example, and a medium breakdown voltage such as about 12 to 18 volts, for example.

Figure 3:
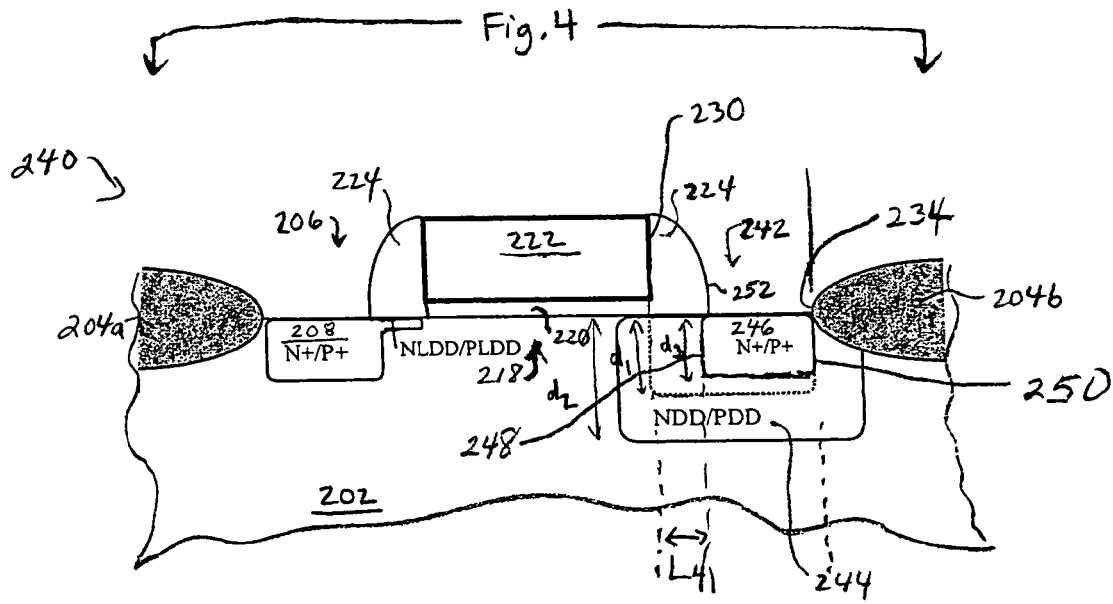
FIG. 3 shows a cross-sectional view of the HV DDDMOS transistor in accordance with an embodiment of the present invention.

FIG. 3 shows a cross-sectional view of a preferred embodiment of the present invention. Like numerals are used in FIG. 3 as were previously used to describe the elements shown in FIGS. 1 and 2. The workpiece 202 may include a semiconductor substrate comprising silicon or other semiconductor materials covered by an insulating layer, for example. The workpiece 202 may also include other active components or circuits, not shown. The workpiece 202 may comprise silicon oxide over single-crystal silicon, for example. The workpiece 202 may include other conductive layers or other semiconductor elements, e.g. transistors, diodes, etc. Compound semiconductors, GaAs, InP, Si/Ge, or SiC, as examples, may be used in place of silicon. The workpiece 202 may also comprise a silicon-on-insulator (SOI) substrate.

Isolation regions 204a and 204b are formed in the workpiece 202. The isolation regions 204a and 204b may comprise field oxide and may comprise an oxide or nitride material, as examples. P wells and/or N wells may be formed in the workpiece 202, not shown.

A first diffusion region 244 having a first depth $d_1$ is formed in the workpiece 202. The first diffusion region 244 may be formed by implanting dopants such as phosphorous (P) or boron (B) into the top surface of the workpiece 202, as examples, although other dopants may alternatively be used to form the first diffusion region 244. The first depth $d_1$ preferably comprises a depth of about 0.3 µm to about 0.4 µm below the top surface of the workpiece 202, as examples, although alternatively, the depth $d_1$ of the first diffusion region 244 may comprise other dimensions.

The dopants of the first diffusion region 244 are driven in to increase the depth $d_1$ of the first diffusion region 244 to a second depth $d_2$. The second depth $d_2$ preferably comprises about 0.55 µm to about 0.8 µm below the top surface of the workpiece 202, as examples, although alternatively, the depth $d_2$ of the first diffusion region 244 may comprise other dimensions.

To drive in the dopants of the first diffusion region 244, the workpiece 202 may be heated. For example, the workpiece 202 may be heated in an anneal process at a temperature of about 1000 to 1100 degrees C. for about 1 to 2 hours, although alternatively, the anneal process may comprise other temperatures and lengths of time, as examples.

A gate insulator 220 and a gate 222 are formed over the workpiece channel region 218, and spacers 224 which may comprise a nitride, for example, are formed over the sidewalls of the gate 222 and the gate insulator 220.

Figure 4:
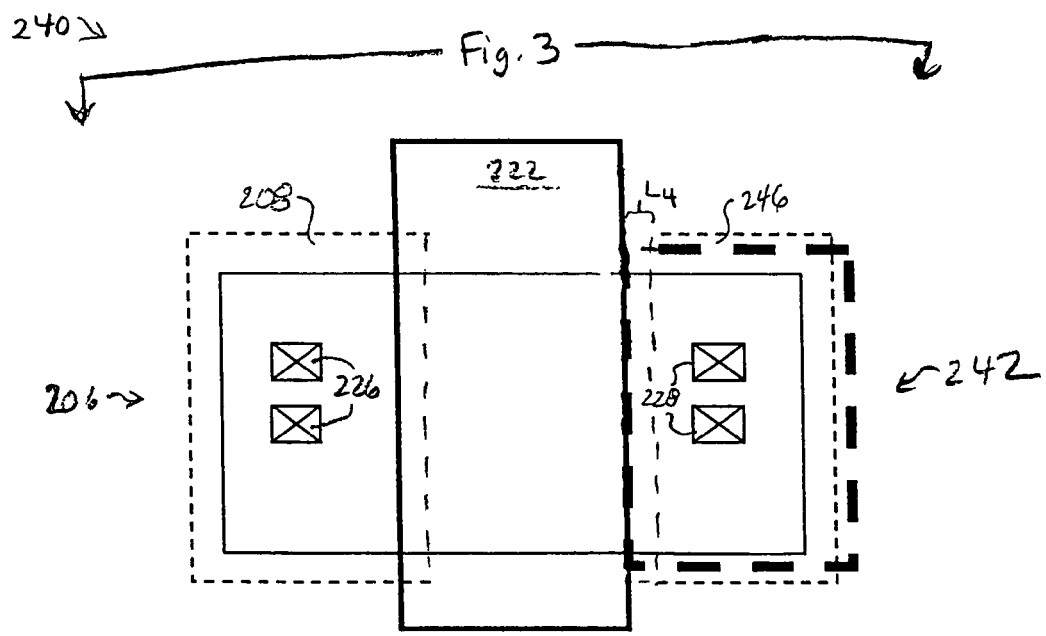
FIG. 4 shows a top view of the transistor shown in FIG. 3.

Second diffusion regions 208 and 246 are then formed in the source 206 and drain 242, respectively, preferably in a single implantation process. The second diffusion regions 208 and 246 may be formed by implanting dopants such as arsenic (As) or B using $BF_2$, as examples, although other dopants may alternatively be used to form the second diffusion regions 208 and 246. The second diffusion regions 208 and 246 comprise a third depth $d_3$ within the workpiece 202 (or within the first diffusion region 244, in the drain region 242). The third depth $d_3$ preferably comprises about 0.35 µm to about 0.5 µm below the top surface of the workpiece 202, as examples, although alternatively, the third depth $d_3$ of the second diffusion regions 208 and 246 may comprise other dimensions. The third depth $d_3$ is preferably less than the second depth $d_2$ of the first diffusion region 244 of the drain region 242, for example. A top view of the device 240 is shown in FIG. 4, wherein contacts 226 and 228 for the source region 206 and drain region 242, respectively, are shown.

An advantage of the device 240 shown is that the second diffusion region 246 of the drain region 242 is self-aligned. For example, the second diffusion region 246 is formed within the edge 252 of the spacer 224 and the edge 234 of the isolation region 204b. The distance $L_4$ between an edge 248 of the second diffusion region 246 of the drain region 242 and an edge 230 of the gate 222 is decreased and is preferably less than the distance $L_2$ shown in FIGS. 1 and 2.

Furthermore, advantageously, the edge 250 of the second diffusion region 246 preferably abuts the edge 234 of the isolation region 204b, such that there is no additional space or chip area (such as distance $L_3$ shown in FIGS. 1 and 2) required by the drain region 242 between the second diffusion region 246 and the isolation region 204b. The physical size or lateral surface area of the novel HV DDDMOS device 240 shown in FIGS. 3 and 4 may be reduced by about 50% compared to the size of the transistor 100 shown in FIGS. 1 and 2. The device 240 has further advantages, to be described further herein.

FIGS. 5 through 10 show cross-sectional views of a preferred embodiment of the present invention at various stages of manufacturing. To avoid repetition, each reference number shown in FIGS. 5-10 may not be described again in detail herein. Rather, similar materials x02, x04, x06, x08, etc . . . are preferably used for the material layers shown as were described for FIGS. 3 and 4, where x=2 in FIGS. 3 through 4 and x=3 in FIGS. 5 through 10. As an example, the preferred and alternative materials and dimensions described for the first diffusion region 244 in the description for FIGS. 3 and 4 are preferably also used for the gate insulating layer 344 in FIGS. 5 through 10.

Figure 5:
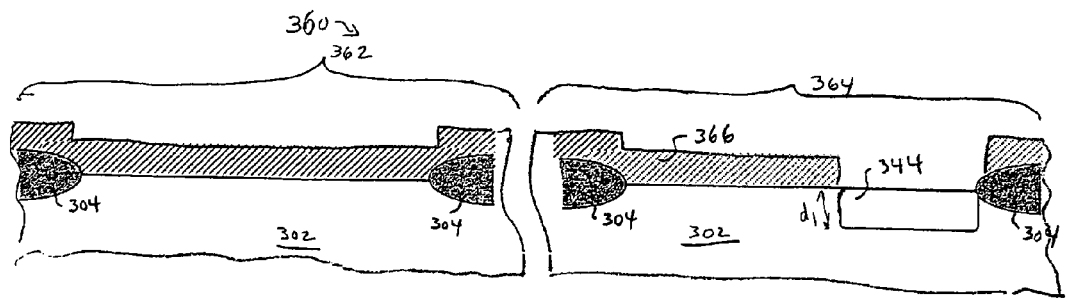
FIGS. 5 through 10 show cross-sectional views of a semiconductor device in accordance with an embodiment of the present invention at various stages of manufacturing.

In the embodiment shown, a semiconductor workpiece 302 includes a low voltage device area 362 and a high voltage device area 364, as shown in FIG. 5. Advantageously, both low voltage devices and high voltage devices may be formed using the same manufacturing process in accordance with embodiments of the present invention. The term "high voltage devices" used with reference to FIGS. 5 through 10 refers to transistors having a higher breakdown voltage than the transistor devices formed in the low voltage device area 362.

First, a workpiece 302 is provided, and isolation regions 304, which may comprise field oxide, for example, are formed in and over the workpiece 302, as shown. Particular areas of the workpiece 302 may be masked, and the isolation regions 304 may be oxidized to form the isolation regions 304, for example. Alternatively, the isolation regions 304 may be formed using other methods, such as by depositing an insulating material and patterning the insulating material, as an example.

A first photoresist layer 366 is disposed over the workpiece 302 and the isolation regions 304, as shown in FIG. 5. The first photoresist layer 366 is patterned and developed, leaving a drain area in the high voltage device region 364 exposed. An implantation process is performed on the workpiece 302. For example, dopants may be implanted such as NDD or PDD, into first depth $d_1$ within the workpiece 302, as shown in FIG. 5. The first diffusion region 344 may be formed by implanting P or B at a depth of about 0.3 µm to about 0.4 µm below the top surface of the workpiece 302, as examples.

Figure 6:
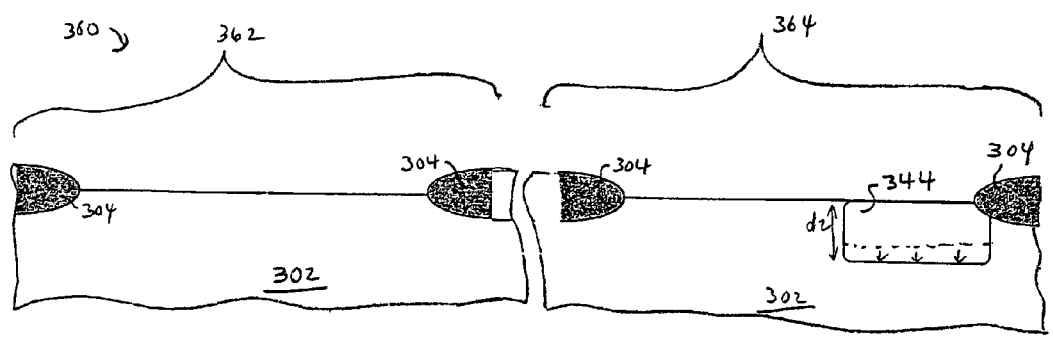

The first photoresist layer 366 is removed, using a strip process, for example, and the workpiece 302 is annealed to thermally drive in the dopants in the first diffusion region 344 in the high voltage device region 364. After the thermal drive-in anneal, which may comprise a temperature of about 1000 to about 1100° C. for about 1 to 2 hours, the first diffusion region 344 comprises a second depth $d_2$ within the workpiece 302, as shown in FIG. 6. The second depth $d_2$ preferably comprises about 0.55 µm to about 0.8 µm below the top surface of the workpiece 302, as examples.

Note that the low voltage device region 362 is preferably not affected by the formation of the first diffusion region 344 in the high voltage device region 364, nor by the anneal process used to drive in the dopants of the first diffusion region 344 to the second depth $d_2$.

Figure 7:
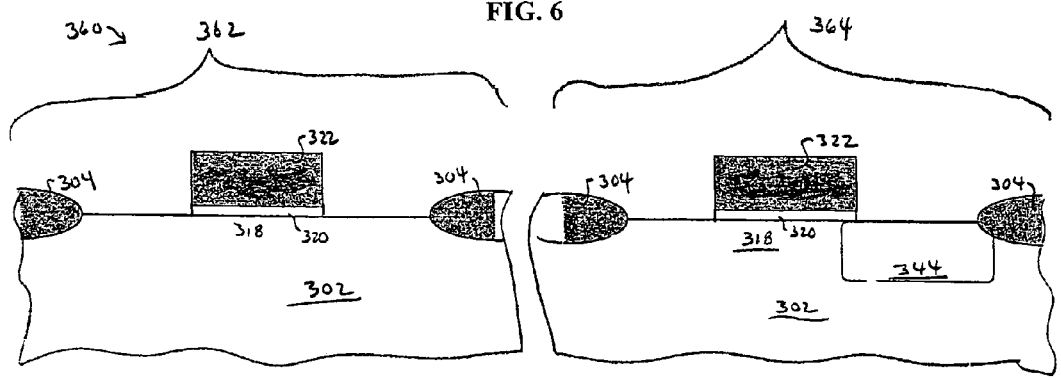
Figure 8:
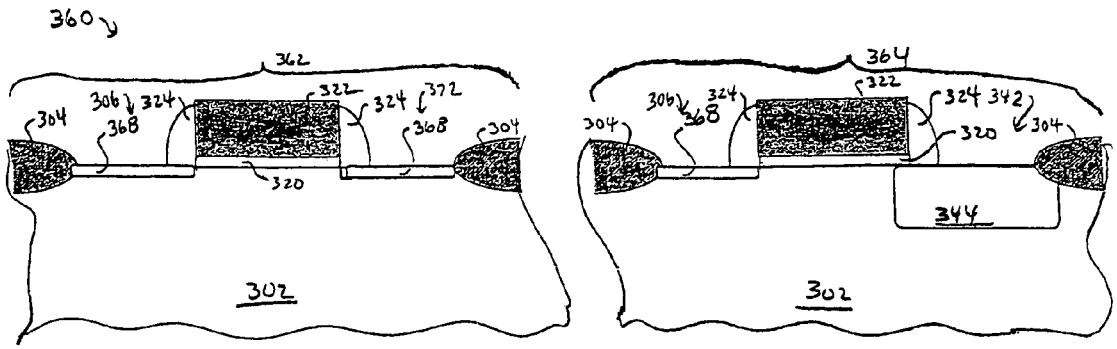

A gate insulator material 320 such as an oxide is deposited or formed over the workpiece 302, isolation regions 304, and the first diffusion region 344, as shown in FIG. 7. The gate insulator material 320 may comprise an oxide or other insulators, as examples. The gate insulator material 320 may comprise about 200 Å to about 1000 Å of $SiO_2$, as examples, although alternatively, the gate insulator material 320 may comprise other materials and dimensions.

A gate 322 material is deposited over the gate insulator material 320. The gate 322 material may comprise polysilicon and may also comprise a silicide at a top region thereof, not shown. The gate 322 material may alternatively comprise other conductive materials such as AlIn or AlInP, as examples. The gate 322 material preferably comprises a thickness of about 2000 Å to about 4000 Å, for example. The gate 322 material alternatively may comprise other materials and dimensions, for example.

The gate 322 material and the gate insulator material 320 are patterned to form a gate 322 in the low voltage device region 362 and also a gate 322 in the high voltage device region 364, as shown. A region of the workpiece 302 residing beneath the gates 322 comprises a channel region 318 in the low voltage device in region 362 and the high voltage device in region 364. The gate 322 material and gate insulator material 320 may be patterned by depositing a photoresist (not shown) over the gate 322 material, patterning the photoresist, and using the photoresist as a mask while exposed portions of the gate 322 material and gate insulator material 320 are etched away, for example.

Next, the workpiece 302 exposed portions are lightly doped to form lightly doped drain regions 368 over regions of the workpiece 302 where a source 306 for the low voltage device, a dram 372 of the low voltage device in region 362, and a source 306 of the high voltage device in region 364 will be formed. The lightly doped drain region 368 may lightly doped with N or lightly doped with P (NLDD or PLDD), for example. The lightly doped drain regions may be formed by dopants such as P or $BF_2$, as examples, although alternatively, other dopants may be used to form the lightly doped drain regions 368, for example.

Spacers 324 are then formed over the sidewalls of the gate 322 of the low voltage device and the gate 322 of the high voltage device in regions 362 and 364, respectively. The spacers 324 may comprise an insulating material such as a nitride, for example. The spacers 324 may alternatively comprise other insulating materials such as oxides, $SiO_2$ or low-k materials, as examples. The spacers 324 may be formed by depositing the spacer 324 material over the gates 322, lightly doped drain regions 368 and isolation region 304, and the workpiece 302 may be exposed to an anisotropic etch, leaving downwardly-sloping edges at the top portion of the spacers 324, as shown. Alternatively, the spacers 324 may be formed by depositing the spacer 324 material over the gates 322, lightly doped drain regions 368 and isolation region 304, and patterning the spacer 324 material using a photoresist as a mask, for example.

Figure 9:
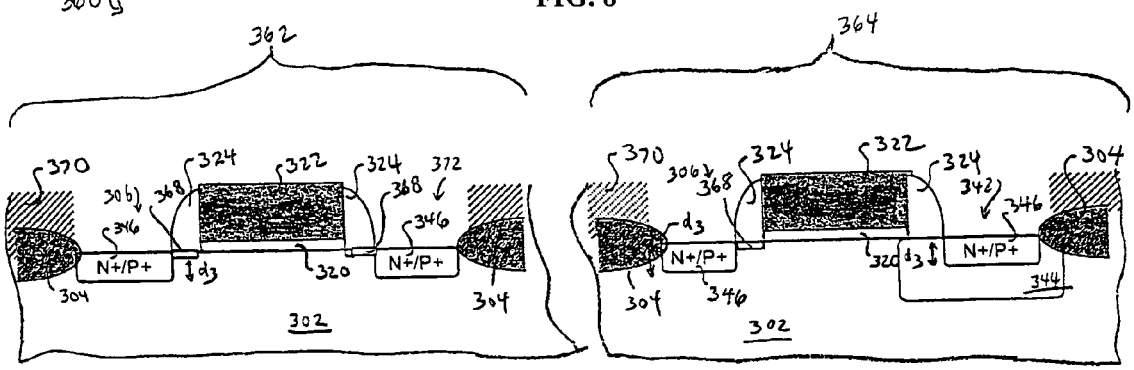

Next, second diffusion regions 346 are then formed in the source 306 and drain 372 of the low voltage region 362 and in the source 306 and drain 342 of the high voltage region 364, as shown in FIG. 9. The second diffusion region 346 may comprise an N+ or P+ implantation, for example. The second diffusion regions 346 may be formed by implanting dopants such as As or $BF_2$, although alternatively, other dopants may be used to form the second diffusion regions 346. The second diffusion regions 346 preferably comprise a third depth $d_3$ within the workpiece 302 (or within the first diffusion region 344, in the drain region 342). The third depth $d_3$ preferably comprises a depth of about 0.35 µm to about 0.5 µm, as an example. The third depth is preferably less than the second depth $d_2$ of the first diffusion region 344 of the drain 342, for example.

The isolation regions 304 may be masked using a second photoresist 370 during the implantation of the second diffusion regions 346, as shown. For example, a second photoresist 370 may be deposited over the top surface of the workpiece 302, and the second photoresist 370 may be patterned to expose everything but the isolation regions 304, such as the gates 322, spacers 324, and second diffusion regions 346, as shown.

Figure 10:
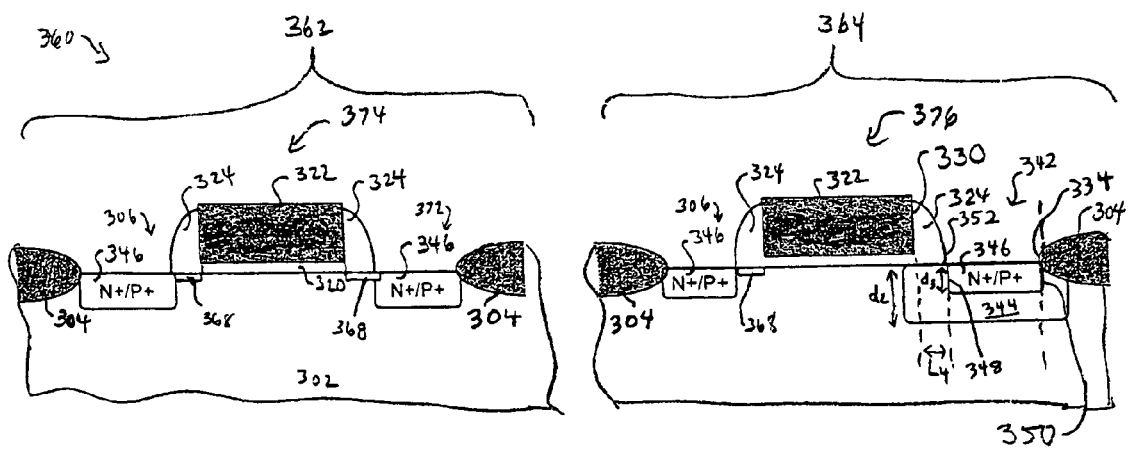

The final device structure 360 comprising a low voltage device 374 formed in region 362 and a high voltage device 376 formed in region 364 is shown in FIG. 10. Advantageously, as described with reference to FIGS. 3 and 4, the edge 350 of the second diffusion region 346 directly abuts the edge 334 of the isolation region 304. Furthermore, the edge 348 of the second diffusion region 346 is closer to the edge 330 of the gate 322 for the high voltage device in region 364 and directly abuts the edge 352 of the spacer 324. Thus, the second diffusion region 346 of the drain region 342 is self-aligned within the workpiece 302 by the edge 334 of the isolation region 304 and the edge 352 of the spacer 324, as shown.

In one embodiment, the first diffusion region 244/344 is formed before the gate dielectric 220/320 and gate 222/322 are deposited and patterned. However, in another embodiment, first, the gate dielectric 220/320 and gate 222/322 may be deposited and patterned, followed by the formation of the first diffusion region 244/344 at a first depth dl and a thermal anneal to drive in dopants of the first diffusion region 244/344 further into the workpiece 202/302 to a second depth d2. Spacers 224/324 are then formed along the sidewalls of the gate dielectric 220/320 and gate 222/322, followed by the formation of the second diffusion regions 246/346. Again, in this embodiment, the second diffusion regions 246/346 are self-aligned between the spacers 224/324 and the adjacent isolation region 204/304.

Figure 11:
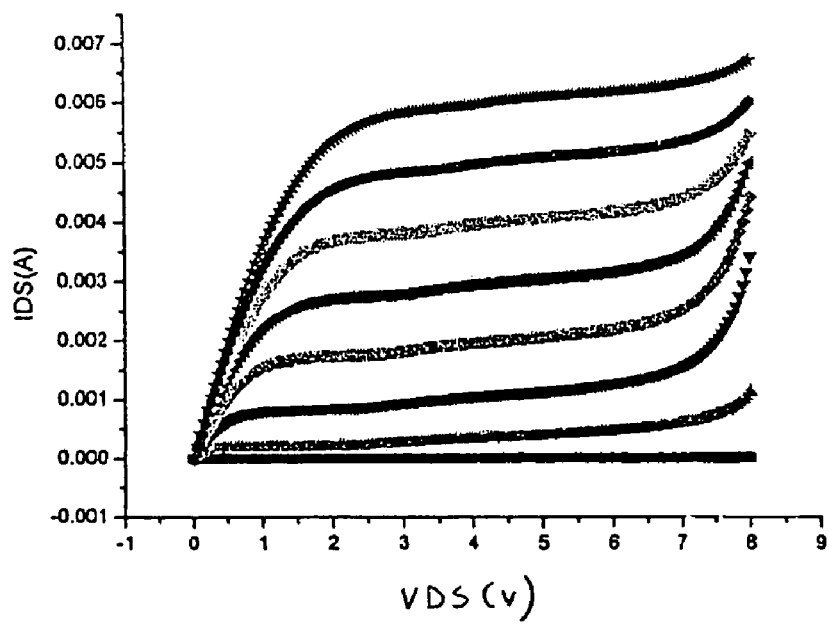
FIGS. 11 and 12 show a transistor performance without drive-in in accordance with an embodiment of the present invention.
Figure 12:
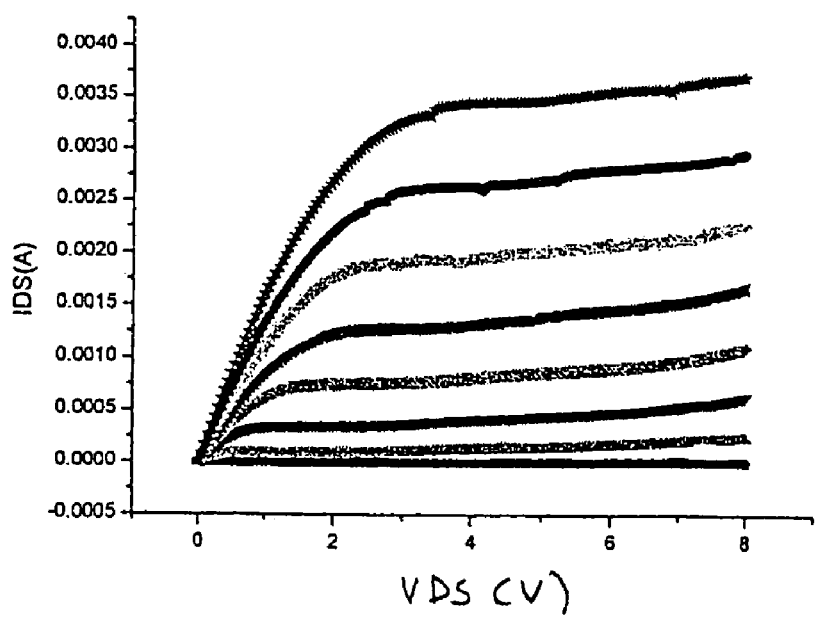

FIGS. 11 and 12 show the transistor performance without drive-in in accordance with an embodiment of the present invention. FIG. 11 shows a plot of the drain-source current $I_{DS}$ in amperes (the y axis) tested over a range of drain-source voltages $V_{DS}$ from 0 to 8 volts (the x axis), for an HV NMOS device manufactured in accordance with an embodiment of the present invention having a channel width of 20 µm and a channel length of 1.0 µm. FIG. 12 is a graph similar to the graph of FIG. 11, for an HV NMOS device manufactured in accordance with an embodiment of the present invention having a channel width of 20 µm and a channel length of 2.5 µm.

Figure 13:
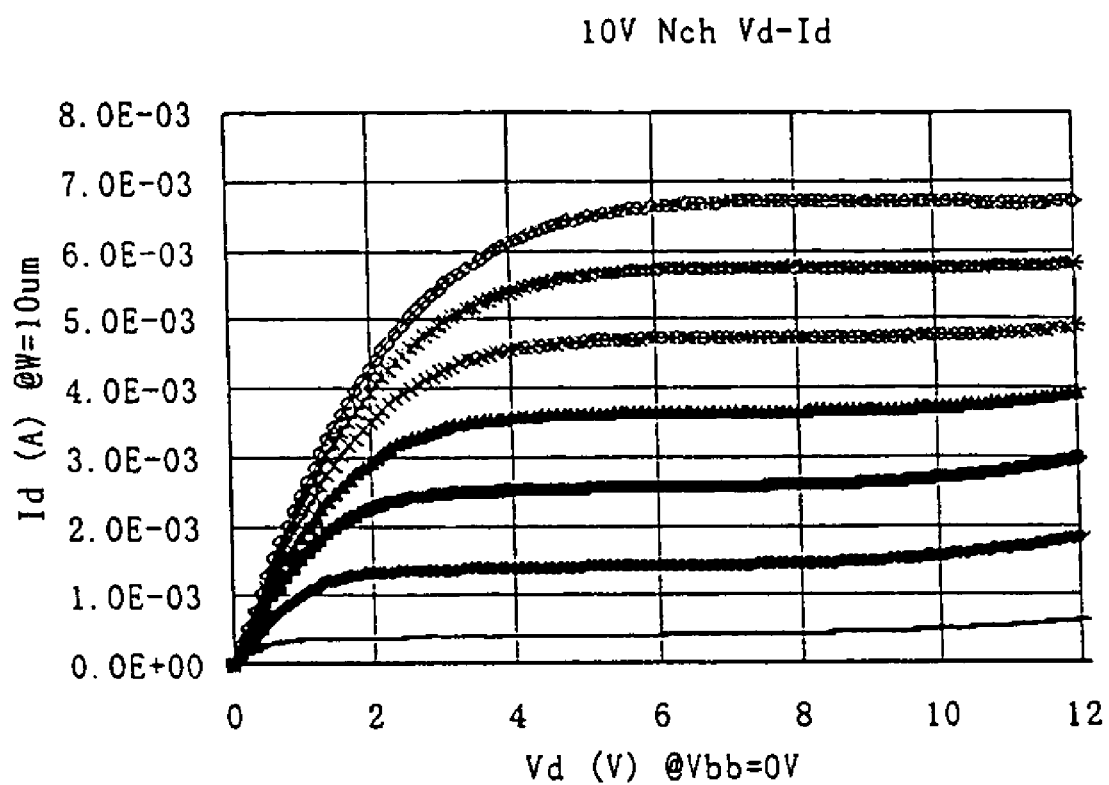
FIG. 13 shows transistor performance of a symmetric HV device with drive-in in accordance with an embodiment of the present invention.

FIG. 13 shows the transistor performance of a symmetric HV device with drive-in in accordance with an embodiment of the present invention. The graph shows $I_{DS}$ vs. $V_{DS}$ for a HV-NMOS device with a 10 µm channel width, a 1.8 µm channel length, and a gate thickness of 350 Å.

Advantages of preferred embodiments of the present invention include providing an HV DDDMOS structure 240/376 and method of manufacture thereof, wherein one of the diffusion regions, the first diffusion region 244/344, of the drain region 242/342, is formed before the formation of the gate 222/322 of the device 240/376. The second diffusion region 246/346 of the drain region 242/342 is self-aligned to the spacer 224/324 adjacent the gate 222/322, which minimizes the use of lateral surface area of the chip. A device 240/376 may be manufactured that has a medium operating voltage, e.g., about 6 volts to 10 volts and that has a breakdown voltage of about 12 to 18 volts; as examples, an NMOS device manufactured in accordance with embodiments of the present invention described herein may have a breakdown voltage of about 13.5 volts, and a PMOS device manufactured in accordance with embodiments of the present invention described herein may have a breakdown voltage of about 16.5 volts.

The novel HV DDDMOS structure 240/376 allows the transistor 240/376 to be manufactured in a smaller scale, e.g., about 50% smaller than prior art high voltage DDD transistors. Advantageously, no additional masks are required to manufacture the device. If low voltage devices 374 or transistors are fabricated on the same integrated circuit, their performance is not degraded by the presence of the high voltage DDDMOS transistors 376 having a medium operating voltage. The resistance $R_{on}$, which is the channel resistance when the device is operated in the linear region, of the HV DDDMOS device 240/376 may be reduced by about 40-50% in accordance with embodiments of the present invention.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
 a workpiece;
 a first isolation region and a second isolation region disposed in the workpiece, the first isolation region being proximate a first source region of the workpiece, the second isolation region being proximate a first drain region of the workpiece, the first source region and the first drain region being separated by a first channel region;
 a first gate over the first channel region of the workpiece with a first and a second sidewall spacer disposed on a first and a second sidewall of the first gate, respectively;
 a first diffusion region disposed in the first drain region of the workpiece but not in the first source region of the workpiece, the first diffusion region being laterally offset from and partially underlying the second sidewall of the first gate, the first diffusion region comprising a first depth within the workpiece; and
 second diffusion regions disposed in the first source region of the workpiece and in the first diffusion region in the first drain region, the second diffusion regions comprising a second depth within the workpiece, the second depth being less than the first depth, wherein the second diffusion region in the first source region abuts the first spacer and comprises a source of a first transistor, and wherein the second diffusion region in the first drain region abuts the second spacer and the second isolation region, and the first diffusion region and the second diffusion region in the first drain region comprise a drain of the first transistor.

2. The semiconductor device according to claim 1, wherein the first diffusion region comprises an n/p type double diffused (NDD/PDD) implantation region.

3. The semiconductor device according to claim 2, wherein the NDD/PDD implantation region comprises P or B.

4. The semiconductor device according to claim 1, further comprising a first gate insulator disposed between the first channel region of the workpiece and the first gate.

5. The semiconductor device according to claim 1, further comprising a lightly doped region disposed in the first source region of the workpiece, wherein the second diffusion region extends through the lightly doped region in the first source region.

6. The semiconductor device according to claim 5, wherein the lightly doped region comprises As, P, or $BF_2$.

7. The semiconductor device according to claim 1, wherein the second diffusion regions comprise As or $BF_2$.

8. A semiconductor device comprising:
 a workpiece;
 a first isolation region and a second isolation region disposed in the workpiece, the first isolation region being proximate a first source region of the workpiece, the second isolation region being proximate a first drain region of the workpiece, the first source region and the first drain region being separated by a first channel region;
 a first diffusion region disposed in the first drain region of the workpiece but not in the first source region of the workpiece, the first diffusion region comprising a first depth within the workpiece;

a first gate disposed over the first channel region of the workpiece proximate the first diffusion region;

second diffusion regions disposed in the first source region of the workpiece and in the first diffusion region in the first drain region, the second diffusion regions comprising a second depth within the workpiece, the second depth being less than the first depth, wherein the second diffusion region in the first source region comprises a source of a first transistor, and wherein the first diffusion region and the second diffusion region in the first drain region comprise a drain of the first transistor;

a third isolation region and a fourth isolation region disposed in the workpiece, the third isolation region being proximate a second source region of the workpiece, the fourth isolation being proximate a second drain region of the workpiece, the second source region being separated from the second drain region by a second channel; and a second gate disposed over the second channel region of the workpiece, wherein the second diffusion region is further disposed over the second source region and over the second drain region, wherein the second diffusion region in the second source region comprises a source of a second transistor, and wherein the second diffusion region in the second drain region comprises a drain of the second transistor.

9. The semiconductor device according to claim 8, wherein the first transistor comprises a transistor having an operating voltage of about 6 to 10 volts.

10. The semiconductor device according to claim 8, wherein the second transistor comprises a transistor having an operating voltage of about 2 to 5 volts.

11. The semiconductor device according to claim 8, wherein the first transistor comprises a transistor having a breakdown voltage of about 12 to 18 volts.

* * * * *